United States Patent
Matsuzawa et al.

(10) Patent No.: US 11,232,995 B2
(45) Date of Patent: Jan. 25, 2022

(54) SEMICONDUCTOR DEVICE

(71) Applicant: DENSO CORPORATION, Kariya (JP)

(72) Inventors: Hiroki Matsuzawa, Kariya (JP);
Bahman Hossini Soltani, Kariya (JP);
Kazuya Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/554,658

(22) Filed: Aug. 29, 2019

(65) Prior Publication Data
US 2020/0075452 A1 Mar. 5, 2020

(30) Foreign Application Priority Data
Sep. 5, 2018 (JP) .............................. JP2018-166151

(51) Int. Cl.
*H01L 23/367* (2006.01)
*H01L 23/46* (2006.01)
*H01L 21/48* (2006.01)
*H01L 23/473* (2006.01)

(52) U.S. Cl.
CPC ...... *H01L 23/3675* (2013.01); *H01L 21/4871* (2013.01); *H01L 21/4882* (2013.01); *H01L 23/3677* (2013.01); *H01L 23/46* (2013.01); *H01L 23/473* (2013.01)

(58) Field of Classification Search
CPC .......................... H01L 23/367; H01L 21/4871
See application file for complete search history.

(56) References Cited

U.S. PATENT DOCUMENTS

| | | | |
|---|---|---|---|
| 2011/0316143 A1* | 12/2011 | Noritake ................. | H01L 23/34 257/713 |
| 2013/0192329 A1* | 8/2013 | Otsubo ..................... | B21J 5/12 72/325 |
| 2014/0091452 A1 | 4/2014 | Katou et al. | |
| 2016/0211192 A1* | 7/2016 | Mizuno ................. | H01L 25/117 |
| 2017/0223875 A1 | 8/2017 | Tsuyuno et al. | |
| 2018/0024599 A1* | 1/2018 | Sakata ................ | H01L 21/4878 361/679.47 |

FOREIGN PATENT DOCUMENTS

| | | | |
|---|---|---|---|
| JP | 2004031483 A | 1/2004 | |
| JP | 2008-187754 A | 8/2008 | |
| JP | 2009-081220 A | 4/2009 | |
| JP | 2012009567 A | 1/2012 | |
| JP | 2013211288 A | 10/2013 | |
| JP | 2016059148 A | 4/2016 | |

* cited by examiner

*Primary Examiner* — Farun Lu
(74) *Attorney, Agent, or Firm* — Harness, Dickey & Pierce, P.L.C.

(57) ABSTRACT

To provide a semiconductor device capable of effectively releasing heat from a semiconductor element, the semiconductor device includes a semiconductor element, a heat sink connected thermally to the semiconductor element and a coolant flow channel formed facing the heat sink. The heat sink is integrally composed of multiple cooling fins projecting toward the coolant flow channel. A linear base of each of the multiple cooling fins inclines relative to a direction in which a coolant is supplied through the coolant flow channel. An inclination of a linear base of each of the cooling fins arranged adjacent to each other in the direction relative to the coolant flow direction is substantially opposite from each other.

6 Claims, 10 Drawing Sheets

FLOW OF COOLANT

FLOW OF COOLANT

SEMICONDUCTOR DEVICE

CROSS-REFERENCE TO RELATED APPLICATION

This patent application is based on and claims priority to Japanese Patent Application 2018-166151, filed on Sep. 5, 2018 in the Japan Patent Office, the entire disclosure of which is hereby incorporated by reference herein.

BACKGROUND

Technical Field

Embodiments of this disclosure relate to a semiconductor device.

Related Art

In a known semiconductor device, a semiconductor element is thermally connected to a heat sink. In such a device, a large number of cooling fins project from a surface of a metal plate of the heat sink to release heat of the semiconductor element.

However, the heat of the semiconductor element cannot effectively be released when the cooling fins simply project from the heat sink. That is, a conventional semiconductor device needs to further improve performance of heat releasing from the semiconductor element.

In view of the above-described problem, various embodiments of the present disclosure are made and an object thereof is to provide a novel semiconductor device capable of effectively releasing heat from the semiconductor element.

SUMMARY

Accordingly, one aspect of the present disclosure provides a novel semiconductor device that includes: a semiconductor element; a coolant flow channel including an inner wall to allow a coolant to flow, and a heat sink thermally connected to the semiconductor element. The heart sink integrally includes multiple cooling fins projecting toward the coolant flow channel. Each of the multiple cooling fins includes a linear base inclining relative to a first direction in which the coolant is supplied through the coolant flow channel. An inclination of a linear base of each of cooling fins arranged adjacent to each other in the first direction is opposite to each other.

As described above, in the semiconductor device according to one embodiment of the present disclosure, since the heat sink includes multiple integral cooling fins, a thermal resistance between the semiconductor element and the cooling fins can be reduced, and accordingly, the heat sink can effectively convey the heat from the semiconductor to the multiple cooling fins.

Further, an inclination of a linear base of each of cooling fins arranged adjacent to each other in a direction of a coolant flow channel relative to the direction is substantially opposite from each other. With this, since coolant flowing through the coolant flow channel effectively contacts the multiple cooling fins, the heat of the semiconductor element conveyed to the multiple cooling fins can be further conveyed to the coolant effectively. That is, the heat of the semiconductor element can be effectively released to the coolant. In other words, effectiveness of heat release from the semiconductor element can be improved.

Hence, as described heretofore, according to the various aspects of the present disclosure, a semiconductor device capable of effectively releasing heat from the semiconductor element can be provided.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein.

DETAILED DESCRIPTION

Figure 1:
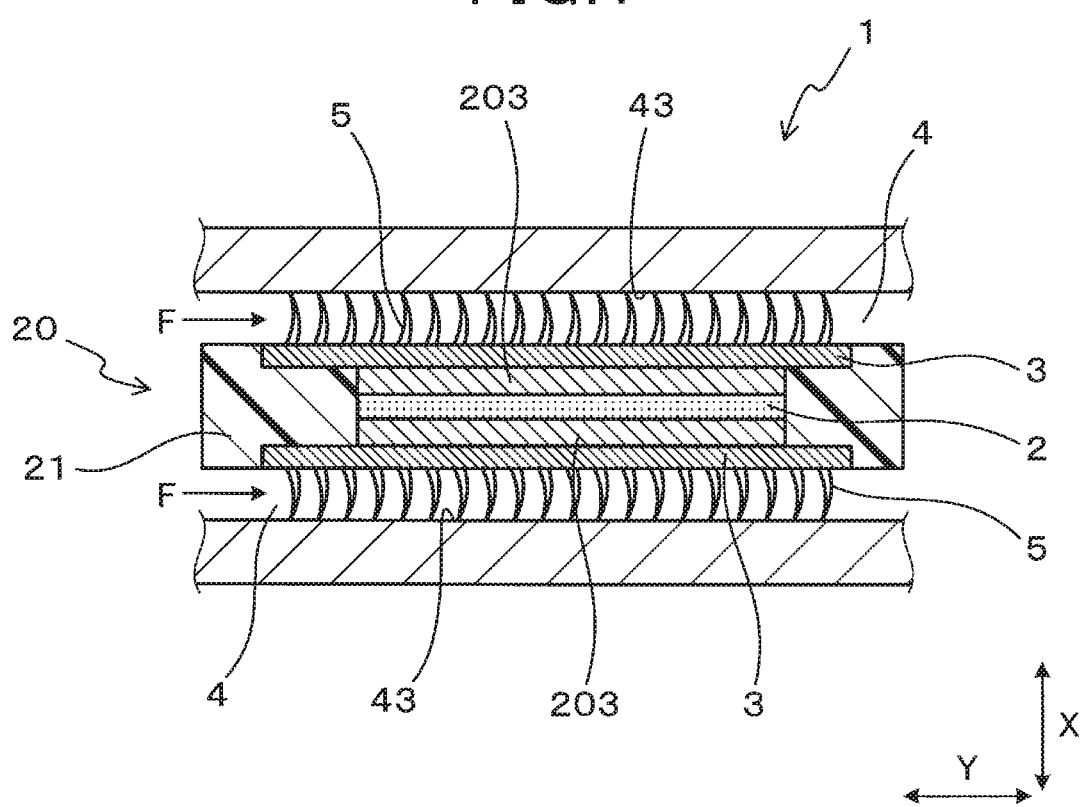
FIG. 1 is a cross-sectional view illustrating an exemplary semiconductor device according to a first embodiment of the present disclosure.

Referring now to the drawings, wherein like reference numerals designate identical or corresponding parts throughout the several views thereof, to FIGS. 1 to 8, an exemplary semiconductor device according to a first embodiment of the present disclosure is described. First, as illustrated in FIG. 1, a semiconductor device 1 of this embodiment of the present disclosure includes a semiconductor element 2, a pair of heat sinks 3 disposed on both sides of the semiconductor element 2 and a pair of coolant flow channels 4 formed on respective outer sides of the pair of heat sinks 3. The heat sinks 3 are thermally connected to the semiconductor element 2. The coolant flow channels 4 are formed facing the respective heat sinks 3.

Figure 2:
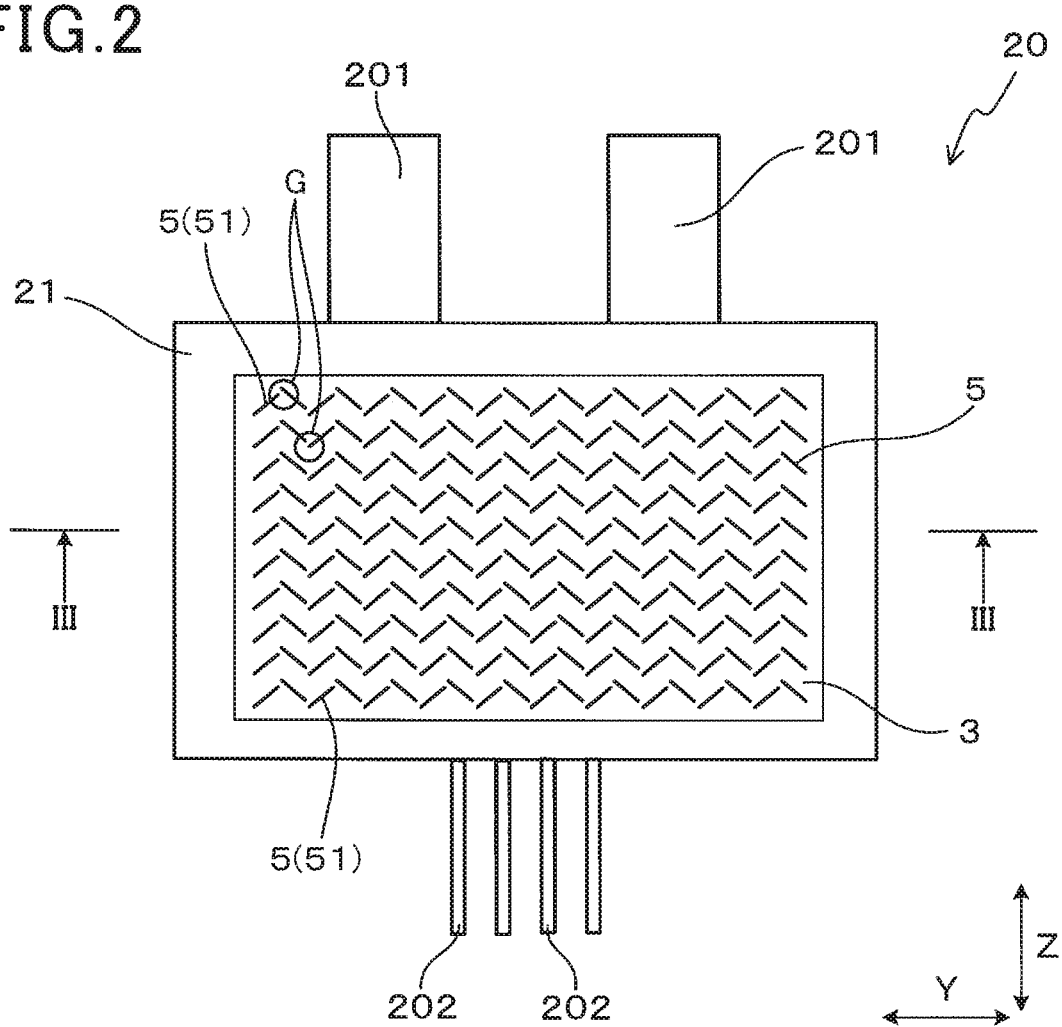
FIG. 2 is a plan view illustrating an exemplary semiconductor module according to first embodiment of the present disclosure.
Figure 4:
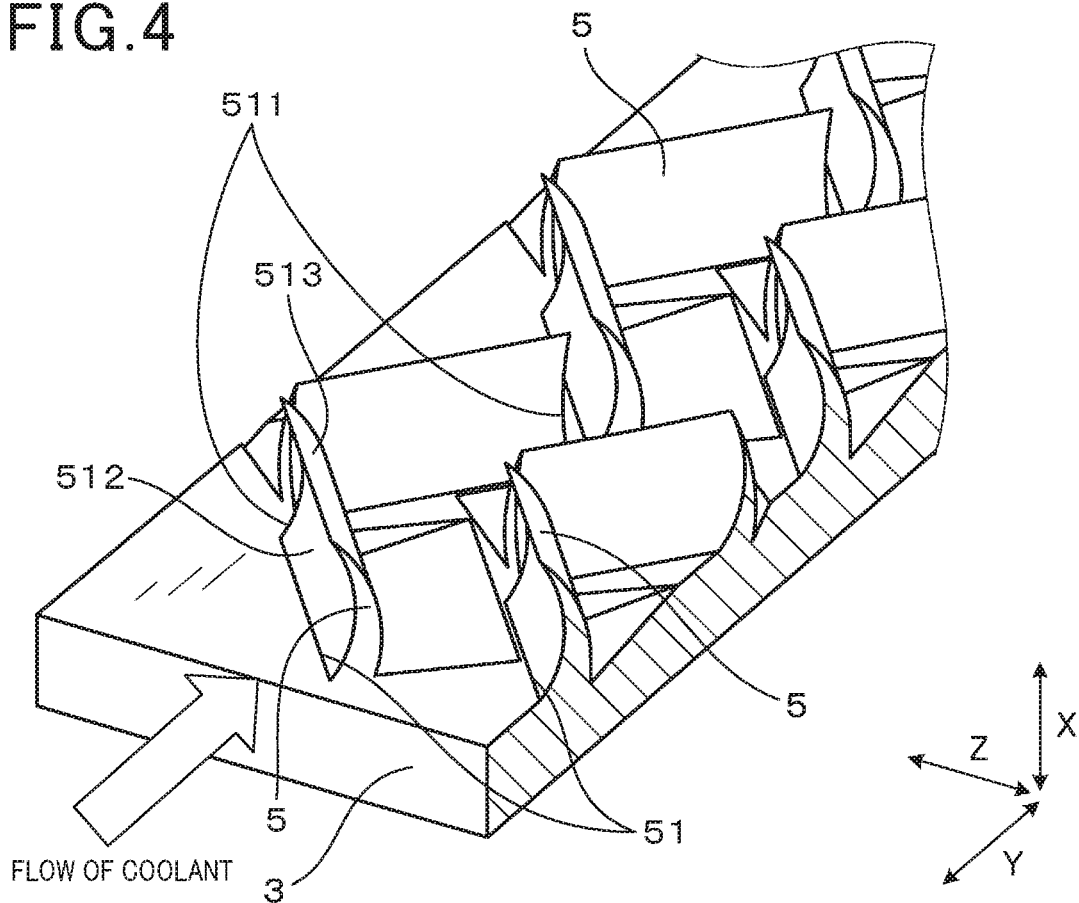
FIG. 4 is a perspective view illustrating exemplary cooling fins according to the first embodiment of the present disclosure.
Figure 5:
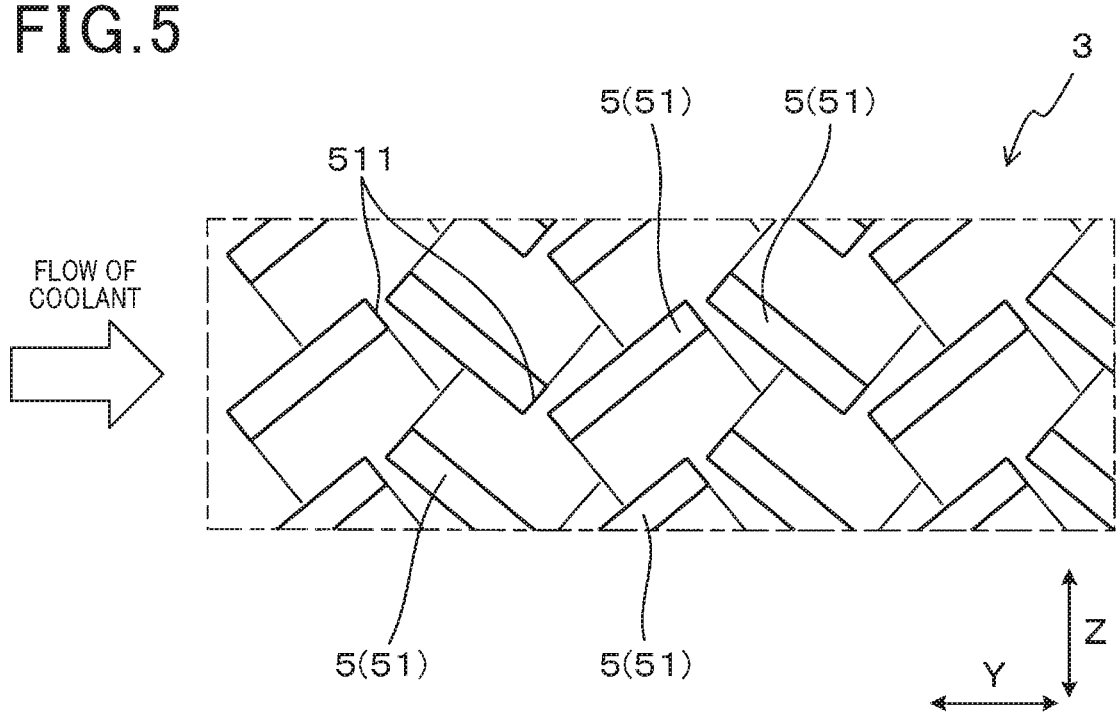
FIG. 5 is a plan view partially illustrating an exemplary heat sink that employs the cooling fins according to the first embodiment of the present disclosure.

Each of the heat sinks 3 is configured by integrally including multiple cooling fins 5 projecting toward the coolant flow channel 4. As illustrated in FIGS. 2, 4 and 5, when viewed in a X-direction parallel to a normal line of the heat sink 3, a linear base 51 of each of the multiple cooling fins 5 inclines either upward or downward to the right relative to a Y-direction i.e., a direction parallel to the coolant flow channel 4). More specifically, an inclination of a linear base 51 of each of the cooling fins 5 neighboring in the Y-direction relative to the Y-direction is substantially opposite from each other.

Figure 3:
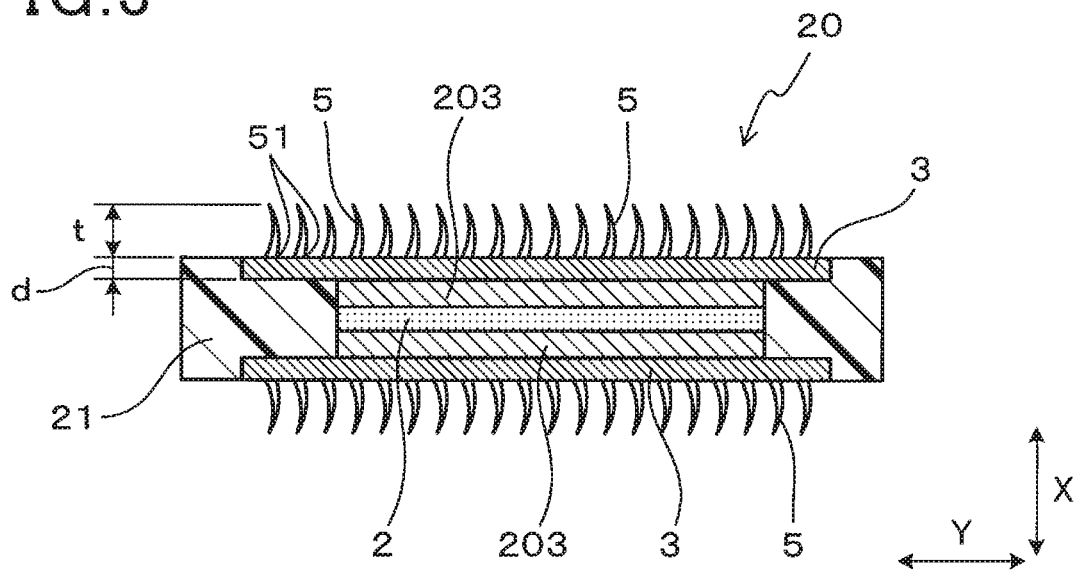
FIG. 3 is a cross-sectional view along a line III-III illustrated in FIG. 2 according to first embodiment of the present disclosure.

As illustrated in FIG. 3, in this embodiment of the present disclosure, the pair of heat sinks 3 is placed on two main planes of the semiconductor element 2, respectively. The semiconductor element 2 and the pair of heat sinks 3 are integrated by using mold resin solidified as a mold resin portion 21, thereby constituting a semiconductor module 20. Hence, the pair of heat sinks 3 is respectively exposed from the mold resin portion 21 to both sides opposite to each other.

Hereinbelow, the X-direction parallel to the normal line of the heat sink 3 is simply referred to as the X-direction sometimes. Also, the Y-direction parallel to the coolant flow channel 4 perpendicular to the X-direction is hereinbelow simply referred to as the Y-direction sometimes. Further, a direction perpendicular to both of the X-direction and the Y-direction is hereinbelow simply referred to as a Z-direction.

As illustrated in FIG. 2, the semiconductor module 20 includes multiple power terminals 201 and multiple control terminals 202 as well. These power terminals 201 and control terminals 202 (positively and negatively) project in the Z-direction. That is, in this embodiment of the present disclosure, the power terminals 201 and the control terminals 202 oppositely project in the Z-direction.

Further, as illustrated in FIG. 3, in the semiconductor module 20, the semiconductor element 2 and the pair of heat sinks 3 are thermally connected to each other via a pair of heat conductive units 203 that respectively intervene therebetween. However, each of the heat conductive units 203 can be configured by a combination of multiple members as described later in a third embodiment of the present disclosure. These heat conductive units 203 are configured to electrically insulate the semiconductor element 2 and the heat sinks 3 from each other, respectively.

As illustrated in FIG. 1, the pair of coolant flow channels 4 is formed respectively facing both of main surfaces of the semiconductor module 20. That is, the coolant flow channels 4 are formed respectively facing the heat sinks 3 exposed from the semiconductor module 20 in the X-direction.

As illustrated in FIG. 3, a large number of cooling fins 5 projects from each of the heat sinks 3. As illustrated in FIGS. 4 to 8, the cooling fins 5 are prepared by partially cutting and raising a surface of each of the heat sinks 3 and are integral therewith. Specifically, as illustrated in FIGS. 3 and 4, each of the cooling fins 5 has a platy shape. The cooling fin 5 is thinner than the heat sink 3. The cooling fin 5 curves to deviate from a direction along which the cooling fin 5 rises.

That is, a cross section of the cooling fin 5 on a X-Y plane curves in a prescribed direction. A radius of this curvature can be, for example, from about 0.5 mm to about 1.5 mm. In addition, the cooling fin 5 gradually becomes thinner as a portion of the cooling fin 5 approaches from a base to the tip thereof. For example, the thickness of the base of the cooling fin 5 may be from about 0.1 mm to about 0.5 mm.

Further, as illustrated in FIGS. 2 and 5, the linear base 51 of each of the large number of cooling fins 5 inclines either upward or downward to the right relative to the Y-direction in this example, in which the coolant is supplied through the coolant flow channel 4 as described earlier. Specifically, one of the cooling fins 5 arranged adjacent to each other in the Y-direction inclines upward to the right relative to the Y-direction, and the other one of the cooling fins 5 arranged adjacent to each other in the Y-direction inclines downward to the right. For example, in this embodiment of the present disclosure, these linear bases 51 of the adjacent cooling fins 5 incline upward and downward to the right relative to the Y-direction by angles of about 40 degrees (i.e., ±40 degrees), respectively, when viewed in the X-direction. That is, some linear bases 51 of cooling fins incline upward to the right relative to the Y-direction. The other linear bases 51 of cooling fins 5 incline downward to the right relative to the Y-direction. Accordingly, a pair of cooling fins 5 arranged adjacent to each other in the Y-direction has mutually opposite deviations from the Y-direction.

Such inverse inclination of each of the linear bases 51 of the adjacent cooling fins 5 in the Y-direction relative to the Y-direction also means that each of the linear bases 51 of the adjacent cooling fins 5 in the Y-direction inversely inclines relative to the Z-direction when viewed in the X-direction. Further, the same inclination relative to the Y-direction means that each of the linear bases 51 of the cooling fins 5 arranged in the Z-direction equally inclines relative to the Y-direction when viewed in the X-direction.

Further, as illustrated in the drawing, a gap G is formed between the cooling fins 5 arranged adjacent to each other in the Y-direction. A size of the gap G can be equal or less than the thickness of the base of the cooling fin 5. As illustrated in FIGS. 2 and 4, for example, the gap G is formed between a downstream end 511 of the cooling fin 5 arranged upstream and a main surface 512 of the cooling fin 5 arranged downstream. Further, as illustrated in FIG. 3, edges of respective adjacent cooling fins 5 arranged through the gap G slightly deviate from each other in the Z-direction.

Further, multiple cooling fins 5 are arranged linearly in a widthwise direction (i.e., the Z-direction perpendicular to both of the normal line direction of the heat sink 3 and the Y-direction of the coolant flow channel 4). An inclination of each of the linear bases 51 of the multiple cooling fins 5 arranged in the widthwise direction relative to the Y-direction (i.e., the flow channel direction) is substantially the same as each other. That is, cooling fins 5 adjacent to each other in the Z-direction are arranged parallel to each other.

As also illustrated in FIG. 3, a height t of the cooling fin 5 in the X-direction of the normal line of the heat sink 3 is larger than a thickness d of the heat sink 3 (see FIG. 3). For example, the height t of the cooling fin 5 can be from about 1.5 times to about 3 times the thickness d of the heat sink 3.

Further, as illustrated in FIG. 1, the cooling fin 5 contacts an inner wall surface 43 of the coolant flow channel 4 arranged opposite to the heat sink 3. In this example, the height t of the cooling fin 5 is approximately equivalent to a thickness of the coolant flow channel 4 (i.e., a dimension in the X-direction).

As a coolant to flow through the coolant flow channel 4, for example, a natural coolant, such as water, ammonia, etc., water mixed with antifreeze liquid of an ethylene glycol type, and a fluorocarbon type coolant such as Fluorinert (trade mark), etc., may be used. Also usable as the coolant are a fluorocarbon type coolant, such as HFC134a, HCFC123, etc., an alcohol type coolant, such as methanol, alcohol, etc., and a ketone type coolant such as acetone, etc.

A flow F of the coolant along the Y-direction can be directed to be able to locate a concave side of the curved cooling fin 5 upstream. However, a convex side of the curved cooling fin 5 can be located upstream as well.

As described earlier, the multiple cooling fins 5 are prepared by partially cutting and raising the surface of the heat sink 3. Herein below, an exemplary method of forming the cooling fins 5 is described with reference to FIGS. 6 to 8 in more detail.

Figure 6:
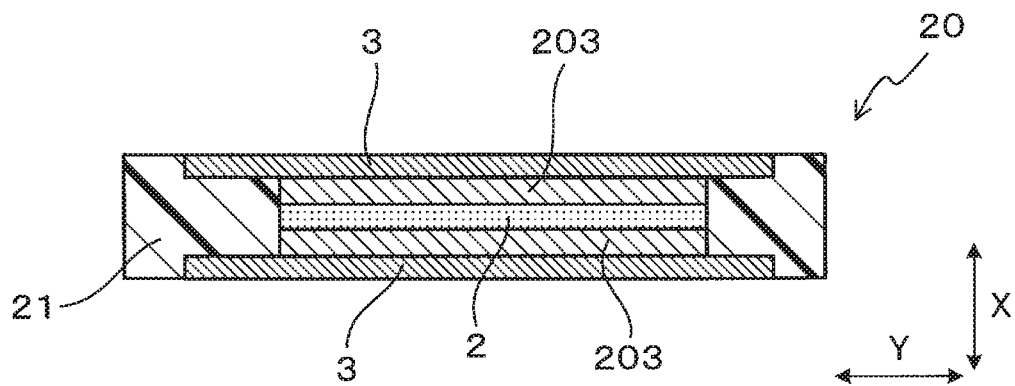
FIG. 6 is a cross-sectional view illustrating an exemplary semiconductor module before the cooling fins are formed thereon according to first embodiment of the present disclosure.
Figure 7:
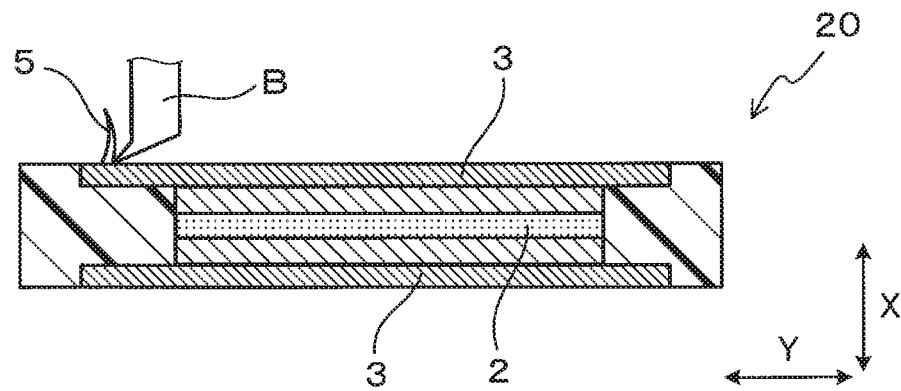
FIG. 7 is a cross-sectional view illustrating an exemplary method of forming a first cooling fin according to first embodiment of the present disclosure.

As a first step, a semiconductor module 20 including a plate-type heat sink 3, on which multiple cooling fins 5 have not yet been formed is prepared as illustrated in FIG. 6. As a second step, a surface layer of the heat sink 3 exposed to a main plane of the semiconductor module 20 is partially cut and raised by using a cutting tool B as illustrated in FIG. 7. Here, a thickness of the surface layer of the heat sink 3 cut and raised by the cutting tool B is around 0.2 mm, for example. Here, a portion of the surface layer of the heat sink 3 cut and raised is kept connected to the heat sink 3. Hence, the portion of the surface layer cut and raised in this way projects from the heat sink 3 in the X-direction thereby constituting one of multiple cooling fins 5. As illustrated in the drawing, the cooling fin 5 may have a warp in that a surface of the cut and raised portion of the surface layer contacted by the cutting tool B becomes convex.

Figure 8:
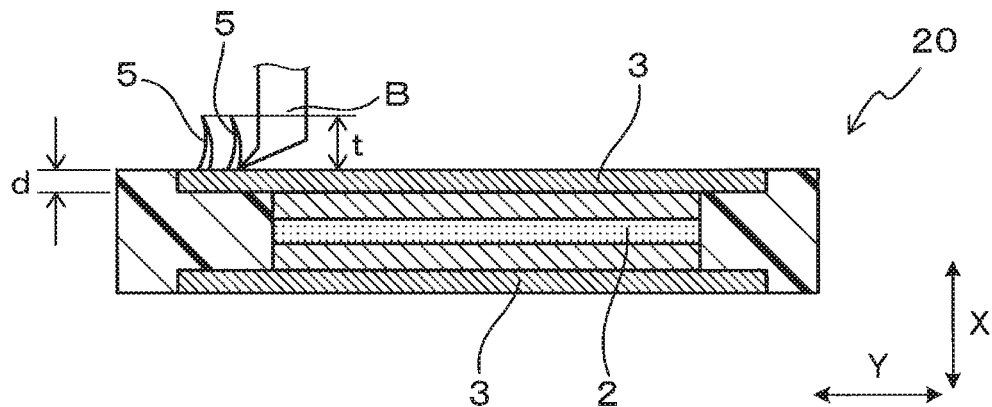
FIG. 8 also is a cross-sectional view illustrating an exemplary method of subsequently forming a second cooling fin in addition to the first cooling fin of FIG. 7 according to first embodiment of the present disclosure.

Subsequently, as illustrated in FIG. 8, the surface layer is repeatedly cut and raised at a prescribed interval by using the cutting tool B, thereby generating multiple cooling fins 5 thereon. Similarly, a surface layer of the other side of the heat sink 3 of the semiconductor module 20 is repeatedly cut and raised at a prescribed interval by using the cutting tool B, thereby generating multiple cooling fins 5 thereon as well. Also, as illustrated in FIGS. 2 and 5, an orientation of each of main surfaces 512 and 513) (i.e., concave and convex surfaces 512 and 513) of each of the multiple cooling fins 5 is not necessarily the same. Hence, the multiple cooling fins 5 are obtained by cutting and raising the surface layer while changing an orientation of the cutting tool B and a direction of cutting. Thus, the large number of cooling fins 5 can be generated on a single sheet of the heat sink 3 as illustrated in FIGS. 2 to 5.

The above-described method for forming the cooling fins 5 is just one example and the present disclosure is not limited thereto. That is, although not illustrated, by using a cutting tool with multiple blades, multiple cooling fins 5 can be cut and raised at the same time, for example.

Now, various advantages obtainable in this embodiment of the present disclosure are described herein below. First, since the heat sink 3 of the semiconductor device 1 is configured by including multiple integrated cooling fins, a thermal resistance between the semiconductor element 2 and the cooling fins 5 can be reduced. Accordingly, the heat sink 3 can effectively convey heat from the semiconductor element 2 to the cooling fins 5.

Further, since the inclination relative to the flow channel extending direction (i.e., the Y-direction) of each of the linear bases 51 of the cooling fins 5 arranged adjacent to each other in the flow channel extending direction is substantially opposite, a coolant flowing through the coolant flow channel 4 can effectively contact multiple cooling fins 5. Accordingly, the heat of the semiconductor element 2 conveyed to the multiple cooling fins 5 as described above can be again effectively conveyed to the coolant as well. As a result, the heat of the semiconductor element 2 can be effectively released to the coolant. That is, effectiveness of heat release from the semiconductor element 2 can be improved.

Further, since each of the cooling fins 5 contacts the inner wall surface 43 of the coolant flow channel 4 located opposite to the heat sink 3, the coolant is enabled to entirely contact the cooling fins 5 in the thickness direction of the coolant flow channel 4 (i.e., in the X-direction). Hence, a percentage of a coolant that can conduct heat exchange with the cooling fins 5 can be increased. As a result, heat release from the semiconductor element 2 can be further effective.

Further, because an inclination relative to the flow channel direction (i.e., the Y-direction) of each of the linear bases 51 of multiple cooling fins 5 arranged in the Z-direction is substantially the same with each other, a small flow passage inclining relative to the Y-direction is formed between a pair of cooling fins arranged adjacent to each other in the Z-direction. In addition, as described earlier, since the inclination relative to the Y-direction of each of the linear bases 51 of the cooling tins 5 arranged adjacent to each other in the Y-direction is substantially opposite, the inclination of each of the small flow passages accordingly becomes opposite too. In this way, a pair of small flow passages respectively having opposite inclinations continues repeatedly, thereby generating a meandering coolant flow. Hence, with such a meandering coolant flow, since the coolant can effectively contact the cooling fins 5, heat release can be more effective.

Further, since the height t of each of the cooling fins 5 is greater than the thickness d of the heat sink 3, performance of heat transfer from the cooling fins 5 to the coolant can be further enhanced.

As described heretofore, according to this embodiment of the present disclosure, the semiconductor device capable of effectively releasing heat from the semiconductor element can be obtained.

Figure 9:
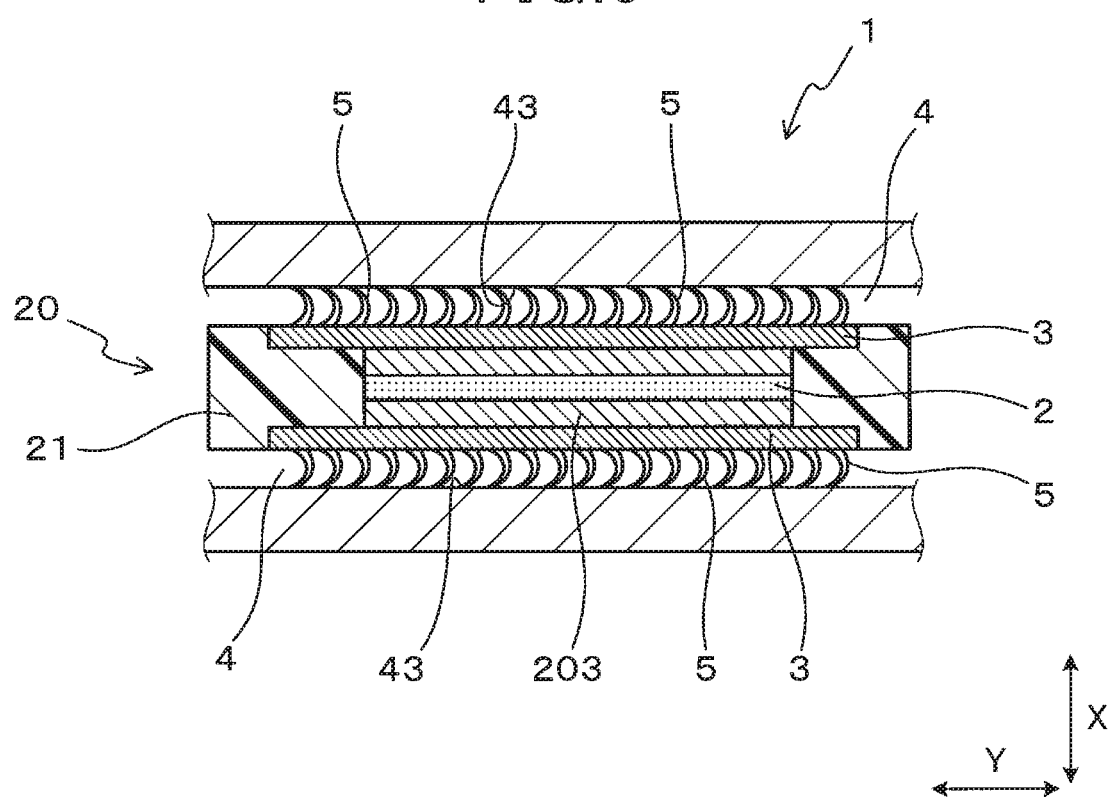
FIG. 9 is a cross-sectional view illustrating an exemplary semiconductor device according to a second embodiment of the present disclosure.

Now, a second embodiment of the present disclosure is described with reference to FIG. 9 and applicable drawings. As illustrated in FIG. 9, according to this embodiment of the present disclosure, each of the cooling fins 5 contacts the inner wall surface 43 of the coolant flow channel 4 with it elastically compressed (i.e., pressure contacting the inner wall surface 43) in the X-direction (i.e., the direction parallel to the normal line of the heat sink 3). That is, the cooling fins 5 cut and raised from the heat sink 3 are in an elastically deformable state in the X-direction. At the same time, a tip of each of the cooling fins 5 pressure contacts the inner wall surface 43 to be pressed by the inner wall surface 43 against the heat sinks 3. Hence, a radius of curvature of each of the cooling fins 5 is smaller than when it is in a free state.

Remaining parts of this embodiment of the present disclosure are substantially equivalent to corresponding parts of the first embodiment of the present disclosure.

Accordingly, according to the second embodiment of the present disclosure, since each of the cooling fins 5 can more reliably contact the inner wall surface 43 of the coolant flow channel 4, the cooling fins 5 can more reliably entirely present in the coolant flow channel 4 in the thickness direction (i.e., the X-direction). As a result, a percentage of a coolant that can conduct heat exchange with the cooling tins 5 can be more reliably increased, thereby enabling more effective and reliable releasing of heat from the semiconductor element 2. Further, substantially the same advantages obtained in the first embodiment of the present disclosure can also be obtained in this embodiment of the present disclosure.

Now, a third embodiment of the present disclosure is described with reference to FIGS. 10 to 12 and applicable drawings. As illustrated FIGS. 10 to 12, in this embodiment of the present disclosure, a semiconductor device 1 is prepared by stacking multiple semiconductor modules 20 in the X-direction. In addition, each of the multiple semiconductor modules 20 includes a flow channel forming section 26 to partially form the coolant flow channel 4. As illustrated in FIG. 12, each of the heat conductive units 203 respectively disposed between the semiconductor element 2 and the heat sinks 3 has the below described specific configuration. That is, in the semiconductor module 20, each of a pair of heat conductive units 203 is composed of a terminal 22, a lead frame 23, and a metal layer 24. Each of the pair of heat conductive units 203 is also composed of an insulating plate 25 as well.

The terminals 22 is made of metal and is bonded to a main surface of one side of the semiconductor element 2 via a solder 209. One of the lead frames 23 (i.e., a lower lead frame 23 in the drawing) is joined to a main surface of the semiconductor element 2 via another solder 209. The other lead frames 23 (i.e., an upper lead frame 23 in the drawing) is joined to a main surface of the terminal 22 via a solder 209. Two metal layers 24 are joined to respective outsides of the lead frames 23 via solders 209. Further, two insulating plates 25 are also disposed on respective main surfaces of outsides of the metal layers 24. Finally, a pair of heat sinks 3 is disposed on respective main surfaces of outsides of the insulating plates 25.

Here, the metal layer 24, the insulating plate 25 and the heat sink 3 can be prepared as an integrated insulation plate with metal (hereinafter sometimes referred to as an insulation metal plate). Specifically, the insulated metal plate is prepared by disposing the metal layer 24 and the heat sink 3 on respective main surfaces of the insulating plate 25 made of ceramic. More specifically, as shown in the drawing, the metal layer 24 and the heat sink 3 are disposed on the respective main surfaces of the insulating plate 25 excluding marginal portions of the insulating plate 25.

Further, such an insulation metal plate is prepared by using an active metal soldering method to joy the metal layer 24 and the heat sink 3 to the respective main surfs of the insulating plate 25, for example. For example, the insulation metal plate can be prepared by joining the metal layer 24 made of aluminum and the heat sink 3 to both of main surfaces of an insulating plate 25 made of aluminum by using respective brazing material. As the brazing material to join the metal layer 24 and the heat sink 3 to both sides of the insulating plate 25, metal brazing material active to alumina can be used.

Further, the pair of heat sinks 3 is exposed from main surfaces of the mold resin portion 21, respectively, and the large number of cooling tins project from an exposed surface of each of the pair of heat sinks 3.

Figure 11:
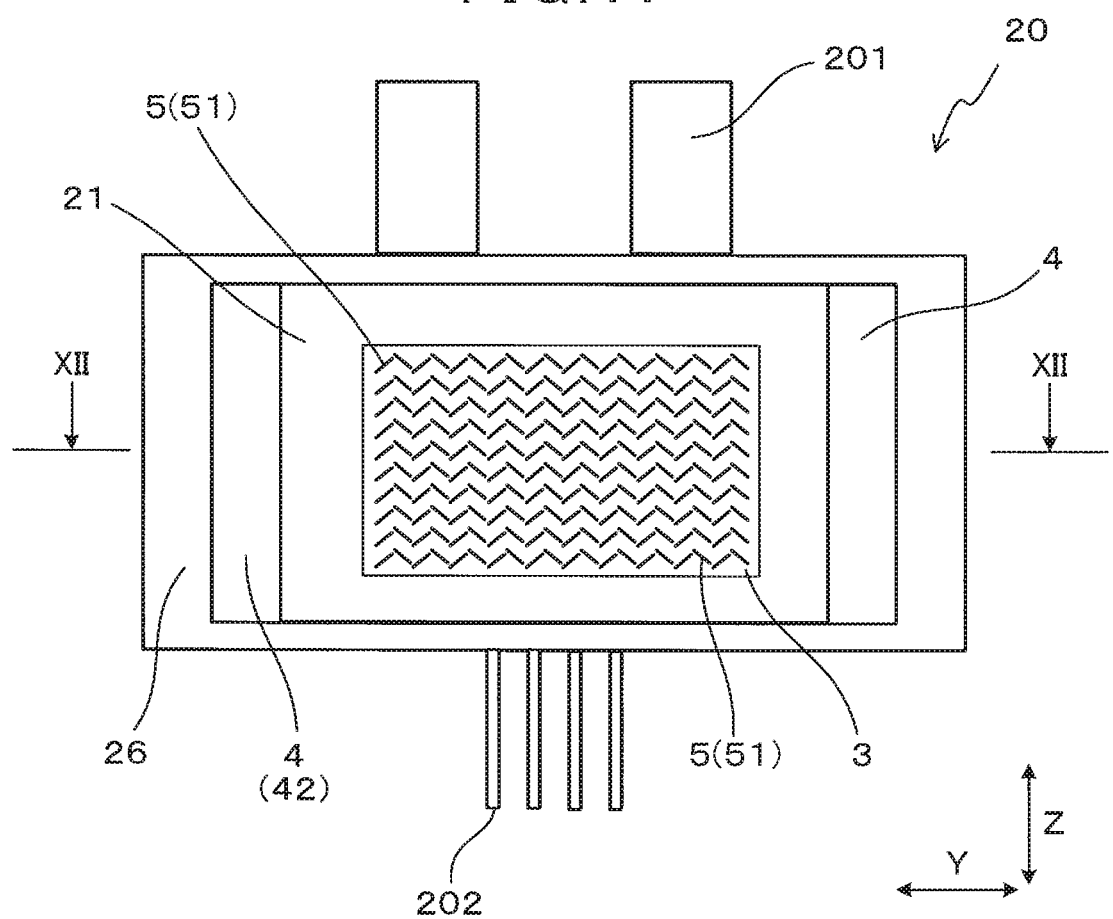
FIG. 11 is a plan view illustrating an exemplary semiconductor module according to the third embodiment of the present disclosure.
Figure 12:
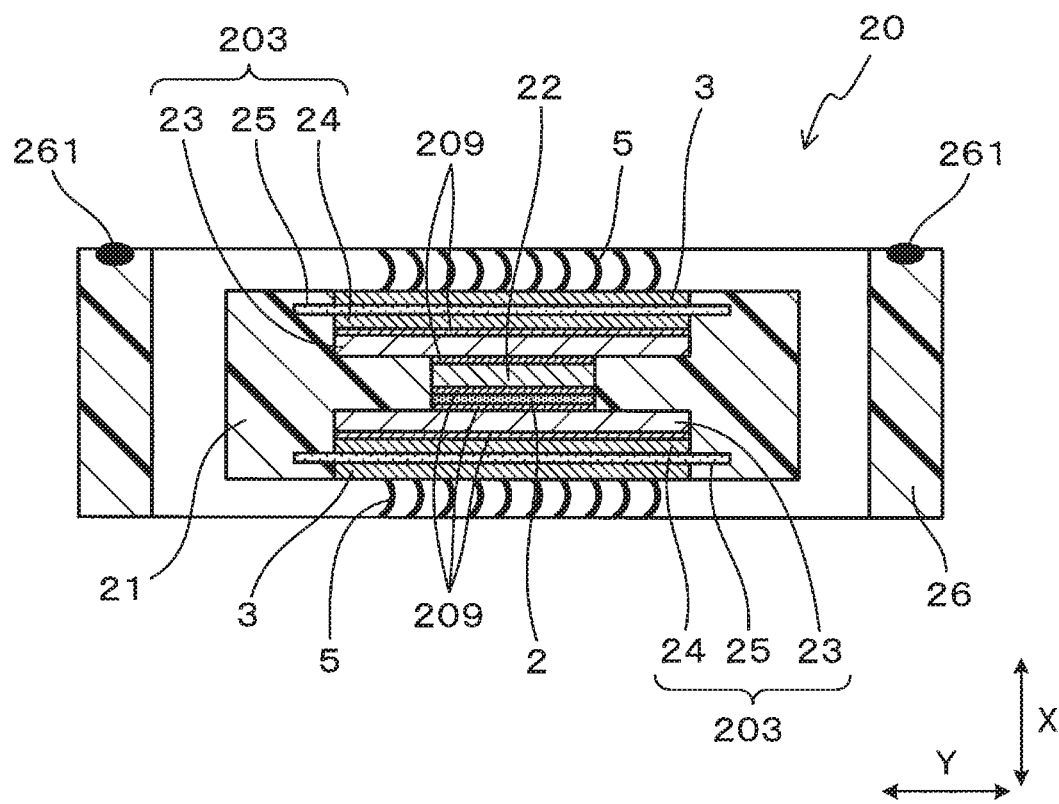
FIG. 12 is a cross-sectional view along a line XII-XII illustrated in FIG. 11.

Further, as illustrated in FIGS. 11 and 12, the semiconductor module 20 also includes the flow channel forming section 26 to partially form the coolant flow channel 4 as well. The flow channel forming section 26 is formed to almost surround a peripheral surface of the mold resin portion 21. The flow channel forming section 26 outwardly extends in both positive and negative directions of a normal line of the main surface of the mold resin portion 21 (i.e. in the X-direction) from the respective main surfaces of the mold resin portion 21. Further, the cooling fins 5 of each of the pair of heat sinks 3 can further project from the flow channel forming section 26 in applicable one of the positive and negative directions.

Figure 10:
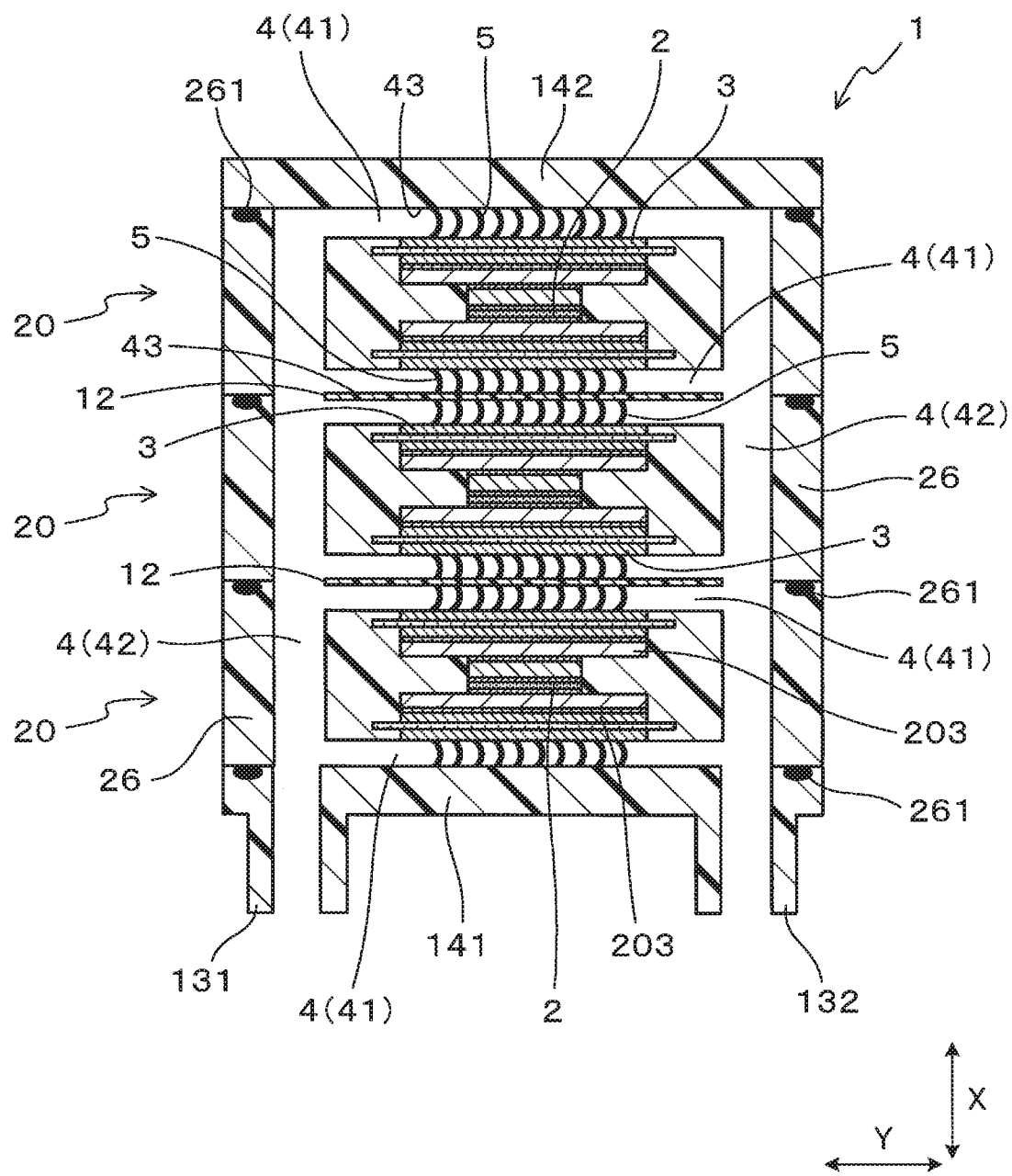
FIG. 10 is a cross-sectional view illustrating an exemplary semiconductor device according to a third embodiment of the present disclosure.

Accordingly, by stacking the semiconductor module 20 configured in this way multiple times in the X-direction as illustrated in FIG. 10, the semiconductor device 1 can be produced. Specifically, edges of the respective flow channel forming sections 26 of the semiconductor modules 20 arranged adjacent to each other in the X-direction contact each other via a sealing member 261. Further, as also illustrated in FIG. 10, between the semiconductor modules 20 arranged adjacent to each other in the X-direction, an intermediate plate 12 having an insulation property is inserted parallel to the heat sink 3.

More specifically, the intermediate plate 12 intervenes between the respective cooling fins 5 of the semiconductor modules 20 arranged adjacent to each other in the X-direction. The intermediate plate 12 is also fixed to portions of the respective semiconductor modules 20 arranged adjacent to each other in the X-direction, in which the cooling fins 5 are not formed. For example, the intermediate plate 12 can be sandwiched between the flow channel forming sections 26 arranged adjacent to each other in the X-direction.

Hence, as described above, because the semiconductor modules 20 are stacked via the intermediate plate 12, a coolant flow channel 4 is formed between the intermediate plate 12 and a surface of the heat sink 3 exposed from the semiconductor module 20. That is, this coolant flow channel 4 is formed along the heat sink 3 (the intermediate plate 12), and hereinafter sometimes referred to as a surface flow channel 4.

Further, as illustrated in FIG. 10, a first end plate 141 having a coolant introduction section 131 and a coolant exhaust section 132 is attached to one end of the stack of the multiple semiconductor modules 20 stacked in the X-direction. Also, a second end plate 142 is also attached to the other end of the stack of the multiple semiconductor modules 20 stacked in the X-direction. Specifically, the first end plate 141 and the second end plate 142 respectively contact the flow channel forming sections 26 of the semiconductor modules 20 via sealing members 261.

Hence, as illustrated in FIG. 10, coolant flow channels 4 acting as coolant surface flow channels are formed facing the heat sinks 3 of the respective semiconductor modules 20 placed outermost sides in the stacking direction thereof. Further, a coolant flow channel 4 is also formed between the mold resin portion 21 and the flow channel forming section 26 in the Y-direction. The coolant flow channel 40 is continuously extended in the X-direction and serves as a linking flow channel 42 that links the multiple surface flow channels 41 together.

Further, the cooling fins 5 of the semiconductor module 20 are exposed to the surface flow channel 41. More specifically, tips of the cooling fins 5 contact the intermediate plate 12, the first end plate 141, and the second end plate 142. Hence, respective surfaces of these intermediate plate 12, first end plate 141 and second end plate 142 contacting the cooling fins 5 act as the inner wall surfaces 43 located opposite to the heat sinks 3 in the coolant flow channel 4.

Hence, in the semiconductor device 1 configured in this way, a coolant introduced from the coolant introduction section 131 into the coolant flow channel 4 passes through the linking flow channel 42 located upstream of the coolant flow channel 4 and is then distributed to the multiple surface flow channels 41. Subsequently, in each of the surface flow channels 41, the coolant is supplied therethrough in the Y-direction. At this moment, the coolant performs heat exchange with the heat sink 3 including the cooling fins 5 thereon. The coolant receiving the heat passes through a linking flow channel 42 located downstream in the coolant flow channel 4, and then exits from the coolant exhaust section 132. Hence, the heat is released from the semiconductor element 2 to the coolant via the heat sink 3 with the multiple cooling fins 5.

Hence, according to the third embodiment of the present disclosure, a semiconductor device 1 capable of effectively releasing heat from a semiconductor element 2 can be obtained again. Further advantages can be obtained as in the first embodiment of the present disclosure as well.

Now, an exemplary result of a first experiment executed to confirm one or more advantages to be obtained by the semiconductor device 1 of the first embodiment of the present disclosure is herein below described with reference to FIG. 13. That is, before the experiment, an experimenting bench model is prepared by simulating the semiconductor device 1 employed in the first embodiment of the present disclosure. However, in this experimenting bench model, the semiconductor element 2 acting as a heat source is substituted by a heater. The heater is thermally contacted to a heat sink 3 having a large number of cooling fins 5. Subsequently, the coolant is flown through the coolant flow channel 4 and a heat transfer rate indicating conductivity of heat from the heater (i.e., equivalent to the semiconductor element 2) to the coolant is measured based on an increase in temperature of the coolant. As the coolant, LLC (Long Life Coolant) is used.

In the experiment, a temperature set to the heater is 100 degrees centigrade. A temperature of the coolant before introduction into the coolant flow channel 4 is 25 degrees centigrade. Subsequently, a heat transfer rate and a pressure drop are measured three times by changing a flow rate of the coolant following through the coolant flow channel.

Further, in this experiment, a heat sink with cooling fins having substantially the same configuration as that of the first embodiment of the present disclosure is prepared as a first sample. Other samples are also prepared as second and third samples by bonding cooling fins to heat sinks by using laser and solder (i.e., not cutting the heat sink), respectively, and are experimented on similarly as comparative experiments.

Figure 13:
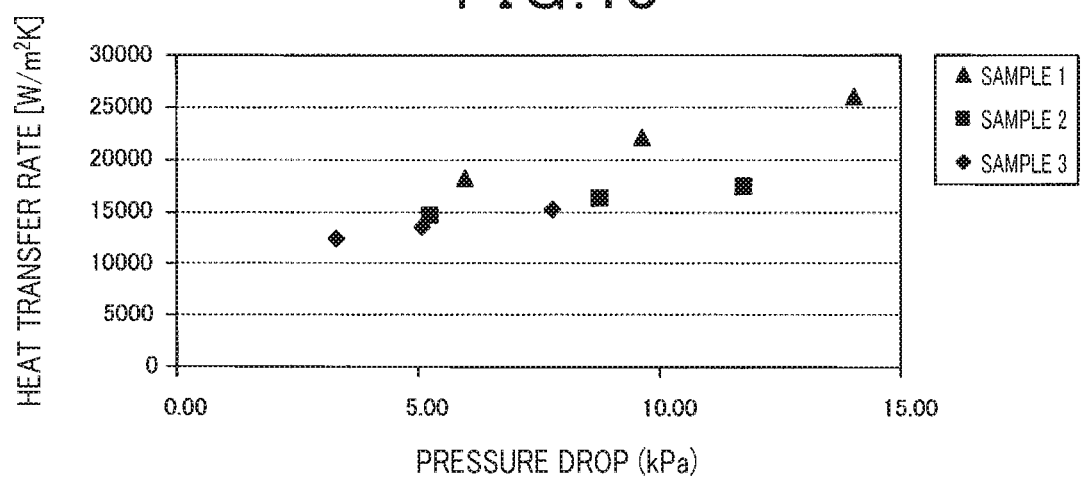
FIG. 13 is a graph illustrating an exemplary experimental result obtained in a first experiment.

A result of each of the experiments is illustrated in FIG. 13. As understood from the drawing, a heat transfer rate of the first sample is the highest among those of the first to third samples. In particular, as an amount of pressure drop increases, a heat transfer rate of the first sample becomes highest among those of the first to third samples. As a result, it is understood that the semiconductor device 1 of the first embodiment of the present disclosure can effectively release heat from the semiconductor element 2. It is also understood that the semiconductor device 1 of the first embodiment of the present disclosure can effectively upgrade heat release from the semiconductor element 2 when an amount of pressure drop increases to a certain extent.

Now, an exemplary result of analysis of heat releasing efficiency produced by changing an arrangement and a shape of each of cooling fins 5 is herein below described with reference to FIGS. 14 to 16, in which perspective views of heat sinks 3 are partially illustrated.

Figure 14:
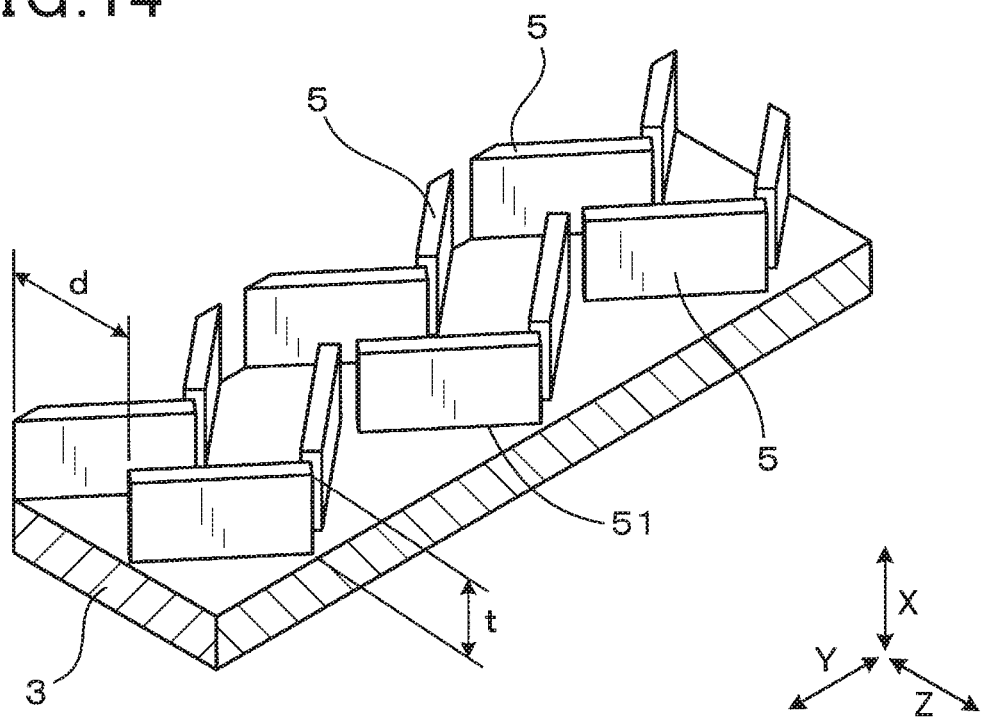
FIG. 14 is a perspective view partially illustrating a sample 21 used in a second experiment.

First, as illustrated in FIG. 14, a sample 21 having substantially the same arrangement as the cooling fin 5 of the first embodiment of the present disclosure is prepared. However, different from the cooling fin 5 having a curved shape of FIG. 4, each of the cooling fins 5 of FIG. 14 is tabular. That is, in the sample 21, a linear base 51 of each of a large number of cooling fins 5 similarly inclines relative to the Y-direction of the flow channel. At the same time, an inclination of each of the linear bases 51 of the cooling fins 5 arranged adjacent to each other in the Y-direction of the flow channel is substantially opposite from each other. In addition, an inclination relative to the Y-direction of the flow channel of each of the linear bases 51 of the multiple cooling fins 5 arranged in the Z-direction is substantially the same to each other.

Figure 15:
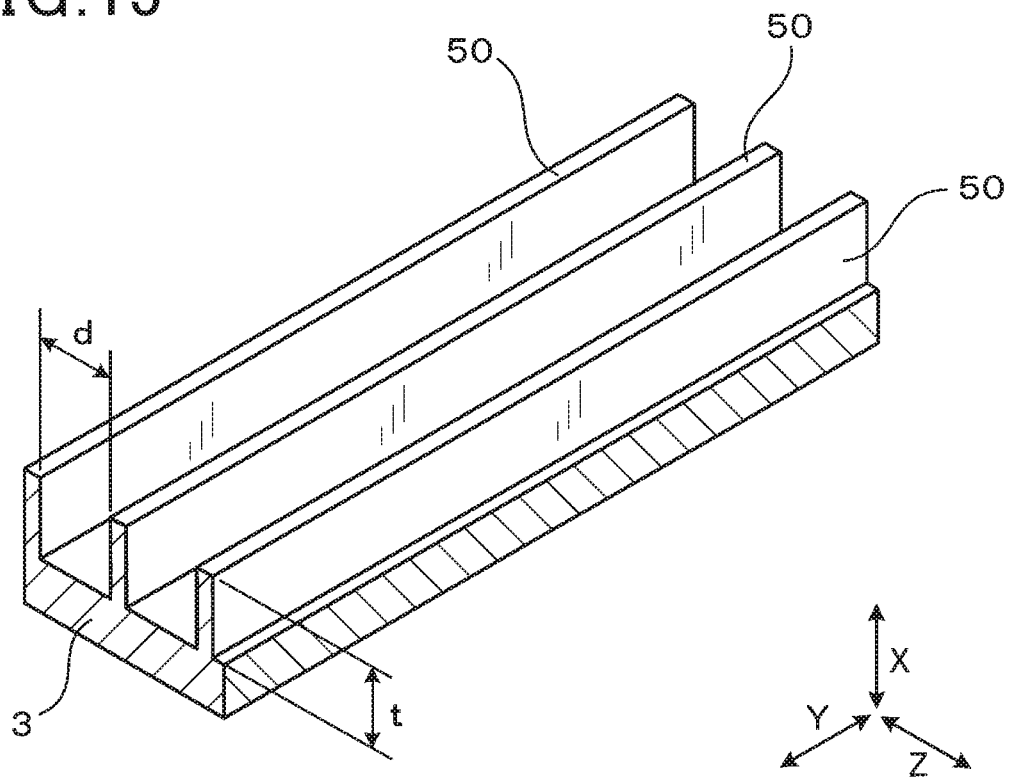
FIG. 15 is a perspective view partially illustrating a sample 22 used in the second experiment.

As illustrated in FIG. 15, a sample 22 is also prepared by placing multiple tabular cooling fins 50 extended in the Y-direction parallel to each other. Further, a sample 23 is also prepared by raising multiple square pole pin state cooling fins 500 from the heat sink 3 as illustrated in FIG. 16.

Figure 16:
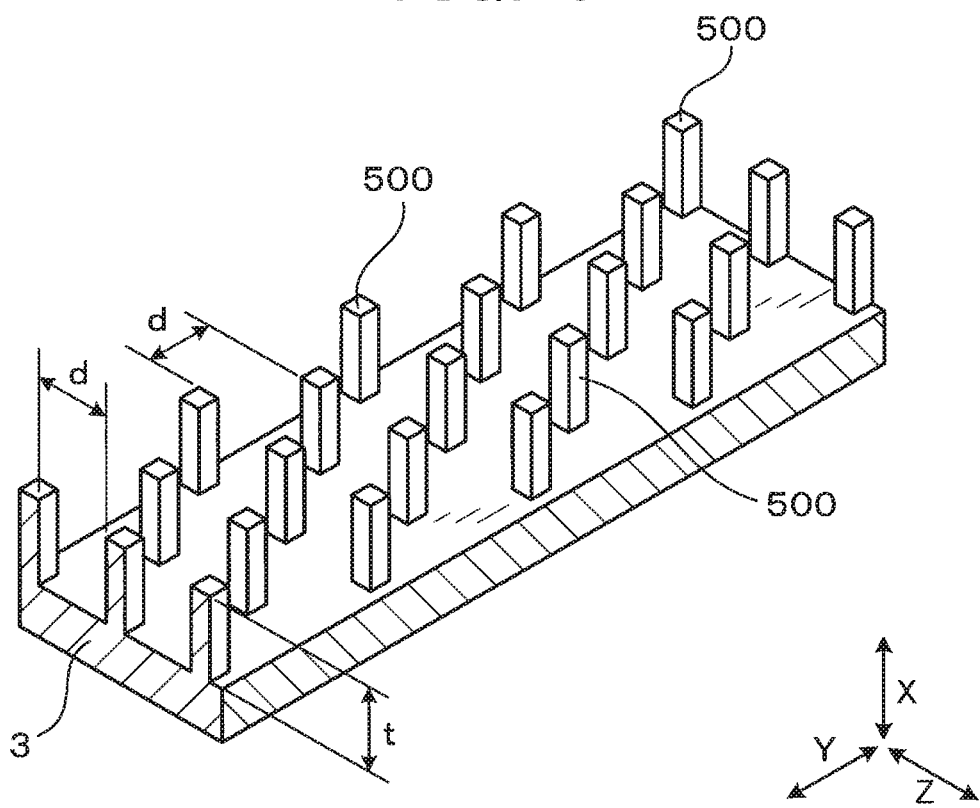
FIG. 16 is a perspective view partially illustrating a sample 23 used in the second experiment.

In these three kinds of samples, a height t and an interval d of the cooling fins 5, 50, and 500 are equalized as illustrated in FIGS. 14 to 16. Specifically, in the sample 23, each of intervals between adjacent cooling fins both in the X and Y-directions amounts to the value d. Further, in each of the samples, the cooling fins 5, 50, and 500 are integral with the heat sink 3.

Then, a heat transfer rate is simulated and analyzed per sample by flowing a coolant through a coolant flow channel 4 formed in each of these samples 21, 22 and 23. The simulation and analysis is executed on condition that a flowing amount of coolant is 0.5 L (liter)/min, a calorie of heat conveyed to the heat sink 3 is 30 W (watt), and a temperature of the coolant before heat exchange is 65 degrees centigrade. Further, substantially the same LLC as employed in the first experiment is employed in this simulation and analysis.

Figure 17:
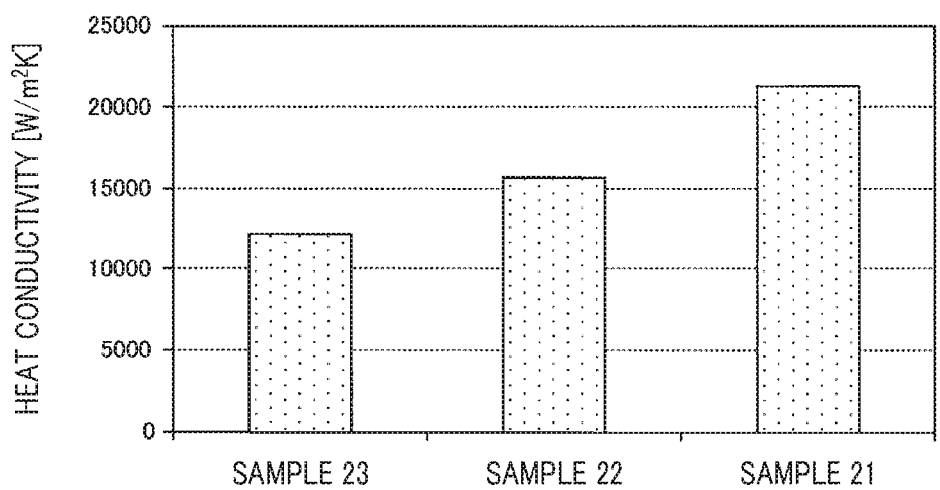
FIG. 17 is a graph illustrating an exemplary experimental result obtained in the second experiment.

An experimental result is illustrated in FIG. 17, and it is understood from the drawing that the sample 21 shows the highest heat transfer rate. Accordingly, it can also be understood that the heat release efficiency can be upgraded most when the cooling fins 5 are arranged with the shape as employed in the first embodiment of the present disclosure.

Further, various alternatives other than the above-described embodiments of the present disclosure can be employed. For example, the flowing direction of the coolant may be opposite to that in the first embodiment of the present disclosure. That is, the convex side of the curve of the cooling fin 5 can be located upstream in the flow of the coolant.

Numerous additional modifications and variations of the present disclosure are possible in light of the above teachings. It is therefore to be understood that within the scope of the appended claims, the present disclosure may be executed otherwise than as specifically described herein. For example, the semiconductor device is not limited to the above-described various embodiments and may be altered as appropriate. Similarly, the semiconductor module is not limited to the above-described various embodiments and may be altered as appropriate.

What is claimed is:
1. A semiconductor device, comprising:
a semiconductor element;
a coolant flow channel including an inner wall to allow a liquid coolant to flow; and
a heat sink thermally connected to the semiconductor element, wherein the heat sink integrally includes multiple cooling fins projecting in a direction normal to the heat sink and away from the heat sink toward the coolant flow channel, each of the multiple cooling fins includes a curved tabular projection having a linear base, the linear base inclines on the heat sink relative to a first direction in which the coolant is supplied through the coolant flow channel, an inclination of a linear base of each of cooling fins arranged adjacent to each other in the first direction is substantially opposite to each other, a tip of each of the multiple cooling fins contacts an inner wall surface of the coolant flow channel, and the multiple cooling fins are composed of cut and raised portions of a surface layer of the heat sink, wherein each of the cut and raised portions
    is a portion cut from the surface layer of the heat sink, and
    is elastically deformable in a direction perpendicular to the surface layer of the heat sink, so as to have a warp, in response to being pressed against the inner wall surface of the coolant flow channel.

2. The semiconductor device as claimed in claim 1, wherein a height of each of the cooling fins is greater than a thickness of the heat sink, as measured in the direction normal to the heat sink.

3. The semiconductor device as claimed in claim 1, wherein a height of each of the cooling fins is about 1.5 to 3 times a thickness of the heat sink.

4. A semiconductor device, comprising:

a semiconductor element;

a coolant flow channel including an inner wall to allow a liquid coolant to flow; and a heat sink thermally connected to the semiconductor element, wherein the heat sink integrally includes multiple cooling fins projecting in a direction normal to the heat sink and away from the heat sink toward the coolant flow channel, each of the multiple cooling fins includes a curved tabular projection having a linear base, the linear base inclines on the heat sink relative to a first direction in which the coolant is supplied through the coolant flow channel, an inclination of a linear base of each of cooling fins arranged adjacent to each other in the first direction is substantially opposite to each other, a tip of each of the multiple cooling fins contacts an inner wall surface of the coolant flow channel, the multiple cooling fins are composed of cut and raised portions of a surface layer of the heat sink, and a height of each of the cooling fins is about 1.5 to 3 times a thickness of the heat sink.

5. A semiconductor device, comprising:

a semiconductor element;

a coolant flow channel including an inner wall to allow a liquid coolant to flow; and a heat sink thermally connected to the semiconductor element, wherein the heat sink integrally includes multiple cooling fins projecting in a direction normal to the heat sink and away from the heat sink toward the coolant flow channel, each of the multiple cooling fins includes a curved tabular projection having a linear base, the linear base inclines on the heat sink relative to a first direction in which the coolant is supplied through the coolant flow channel, an inclination of a linear base of each of cooling fins arranged adjacent to each other in the first direction is substantially opposite to each other, a tip of each of the multiple cooling fins contacts an inner wall surface of the coolant flow channel, the multiple cooling fins are composed of cut and raised portions of a surface layer of the heat sink, each of the multiple cooling fins curves to deviate from a direction along which the cooling fin projects, each of the multiple cooling fins gradually becomes thinner as the cooling fin projects from the linear base to the tip, and each of the cut and raised portions is elastically deformable in a direction perpendicular to the surface layer of the heat sink, so as to have a warp, in response to being pressed against the inner wall surface of the coolant flow channel.

6. The semiconductor device as claimed in claim 5, wherein each of the multiple cooling fins curves with a radius of curvature from 0.5 millimeters to 1.5 millimeters from the linear base to the tip.

\* \* \* \* \*